United States Patent
Ito et al.

(10) Patent No.: US 8,798,981 B2
(45) Date of Patent: Aug. 5, 2014

(54) CIRCUIT SIMULATION USING STEP RESPONSE ANALYSIS IN THE FREQUENCY DOMAIN

(75) Inventors: Choshu Ito, San Mateo, CA (US); William Loh, Fremont, CA (US)

(73) Assignee: LSI Corporation, San Jose, CA (US)

(*) Notice: Subject to any disclaimer, the term of this patent is extended or adjusted under 35 U.S.C. 154(b) by 1435 days.

(21) Appl. No.: 12/143,895

(22) Filed: Jun. 23, 2008

(65) Prior Publication Data

US 2009/0319251 A1    Dec. 24, 2009

(51) Int. Cl.
*G06G 7/56* (2006.01)
*G06F 17/50* (2006.01)

(52) U.S. Cl.
CPC ............ *G06F 17/5036* (2013.01); *G06F 17/50* (2013.01); *G06F 17/5045* (2013.01); *G06F 17/5009* (2013.01)
USPC .................................. 703/15; 703/5; 703/14

(58) Field of Classification Search
CPC .. G06F 17/50; G06F 17/5009; G06F 17/5045
USPC ................................................ 703/15, 5, 14
See application file for complete search history.

(56) References Cited

U.S. PATENT DOCUMENTS 8,306,804 B2 * 11/2012 Boselli et al. .................... 703/14

OTHER PUBLICATIONS

Luis Moura, Izzat Darwazeh, "Introduction to Linear circuit Analysis and Modelling, From DC to RF", 2005.*
PLECS, "Piece-wise Linear Electrical Circuit Simulation", User Manual Version 2.0, Mar. 2008.*
"Lessons in Electrical Circuits", vol. II-AC, sixth edition. Jul. 25, 2007.*
Jayong Koo, "Frequency-Domain Measurement Method for the Analysis of ESD Generators and Coupling", IEEE, Aug. 2007.*
Andrew House, "The Convolution Sum for DT LTI systems", Jun. 2004.*
Jaesik Lee, "Chip Level charged device Modeling and simulation in CMOS Integrated Circuits", Jan. 2003.*
J. Koo et al., "Frequency-Domain Measurement Method for the Analysis of ESD Generators and Coupling," IEEE Transactions on Electromagnetic Compatibility, Aug. 2007, pp. 504-511, vol. 49, No. 3.

* cited by examiner

*Primary Examiner* — Thai Phan
*Assistant Examiner* — Angel Calle
(74) *Attorney, Agent, or Firm* — Otterstedt, Ellenbogen & Kammer, LLP

(57) ABSTRACT

A method for simulating a response of a circuit to an ESD input stimulus applied to the circuit includes the steps of: receiving a description of the circuit into a circuit simulation program, the circuit including at least one mutual inductance element indicative of magnetic coupling in the circuit; generating a linear approximation of nonlinear elements in the circuit at respective DC bias points of the nonlinear elements; obtaining a frequency domain transfer function of the circuit; obtaining a time domain impulse response of the circuit as a function of the frequency domain transfer function; integrating the time domain impulse response to yield a step response of the circuit, the step response being indicative of a response of the circuit to the ESD input stimulus; and analyzing the step response of the circuit to determine whether the circuit will operate within prescribed parameters corresponding to the circuit.

20 Claims, 3 Drawing Sheets

300

400

CIRCUIT SIMULATION USING STEP RESPONSE ANALYSIS IN THE FREQUENCY DOMAIN

FIELD OF THE INVENTION

The present invention relates generally to the electrical, electronic, and computer arts, and more particularly relates to electronic circuit simulation.

BACKGROUND OF THE INVENTION

Many circuit simulator users have, at one time or another, observed a simulation which fails to converge or is slow to converge. Nonconvergence generally results from the failure of a nonlinear solution algorithm (e.g., Newton-Raphson algorithm) associated with the simulation program; it means the simulator failed to determine a set of node voltages and branch currents for the circuit being simulated which conform to Kirchhoff's voltage and current laws to which the simulator is bound. There are several reasons the circuit simulator may fail to converge. Some of the problems may be traced to the nonlinear solution algorithm itself, some to the type of analysis being performed (e.g., step response is more likely to have nonconvergence issues compared to a ramp response), and others to the circuit element models. Transient circuit simulation that includes several mutual inductance elements often fails to converge to a reasonable solution due primarily to the high complexity of the system. Nonconvergence and/or slow convergence are probably among the most persistent and challenging problems facing circuit simulator users; and the problems are not confined to a specific circuit simulator or hardware platform.

Generally, a given input/output circuit design may be complex and involve making a trade-off between performance and reliability. For example, in a typical input/output circuit design process, electrostatic discharge (ESD) protection devices may be added to the input/output circuit. The ESD protection devices and the input/output circuit would then be implemented in silicon and tested to determine whether or not the circuit meets design specifications. Circuit simulation prior to implementation in silicon allows the circuit designer to optimize circuit performance and yet reduce the number of costly iterations in silicon. Simulating circuit behavior in the presence of an ESD input stimulus, however, poses particularly unique challenges and is therefore often avoided. This is primarily because an ESD pulse exhibits a comparatively fast rise or fall time, typically on the order of about a few tens of picoseconds (ps) or less, and a comparatively large magnitude voltage and/or current, typically on the order of hundreds of volts and/or several amperes, respectively. The sharp edge of the ESD pulse often creates discontinuities in the transient analysis performed by the simulation program which can result in nonconvergence problems, particularly when there are nonlinear elements in the circuit being simulated.

Accordingly, there exists a need for techniques for performing circuit simulation which do not suffer from one or more of the above-described problems associated with conventional circuit simulation approaches.

SUMMARY OF THE INVENTION

Illustrative embodiments of the present invention meet the above-noted need by providing techniques for simulating a response of a circuit to an ESD input stimulus applied to the circuit in such a manner as to beneficially reduce nonconvergence and/or slow convergence problems typically associated with conventional ESD simulation approaches. Techniques of the present invention accomplish this by using frequency domain analysis to avoid transient simulation nonconvergence issues during the ESD simulation. Results of the ESD simulation are used to predict whether or not the circuit will function within specified circuit parameters. In this manner, circuit performance and/or reliability can be advantageously optimized in the presence of the ESD input stimulus.

In accordance with one aspect of the invention, a method for simulating a response of a circuit to an ESD input stimulus applied to the circuit is provided. The method includes the steps of: receiving a description of the circuit into a circuit simulation program, the circuit including at least one mutual inductance element indicative of magnetic coupling in the circuit; generating a linear approximation of nonlinear elements in the circuit at respective direct current (DC) bias points of the nonlinear elements; obtaining a frequency domain transfer function of the circuit; obtaining a time domain impulse response of the circuit as a function of the frequency domain transfer function; integrating the time domain impulse response to yield a step response of the circuit, the step response being indicative of a response of the circuit to the ESD input stimulus; and analyzing the step response of the circuit to determine whether the circuit will operate within prescribed parameters corresponding to the circuit.

In accordance with another aspect of the invention, apparatus for simulating a response of a circuit to an ESD input stimulus applied to the circuit includes memory and at least one processor coupled to the memory. The processor is operative: to receive a description of the circuit into a circuit simulation program, the circuit including at least one mutual inductance element indicative of magnetic coupling in the circuit; to generate a linear approximation of nonlinear elements in the circuit at respective direct current (DC) bias points of the nonlinear elements; to obtain a frequency domain transfer function of the circuit; to obtain a time domain impulse response of the circuit as a function of the frequency domain transfer function; to integrate the time domain impulse response to yield a step response of the circuit, the step response being indicative of a response of the circuit to the ESD input stimulus; and to analyze the step response of the circuit to determine whether the circuit will operate within prescribed parameters corresponding to the circuit.

These and other features, aspects and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an exemplary method for performing circuit simulation in response to an ESD stimulus. It is to be understood, however, that the techniques of the present invention are not limited to the method or application shown and described herein. Rather, embodiments of the invention may be implemented in any application that can benefit from improved circuit simulation techniques, particularly the simulation of a circuit response to an input stimulus having a substantially steep rise or fall time and a large voltage and/or current magnitude.

Figure 1:
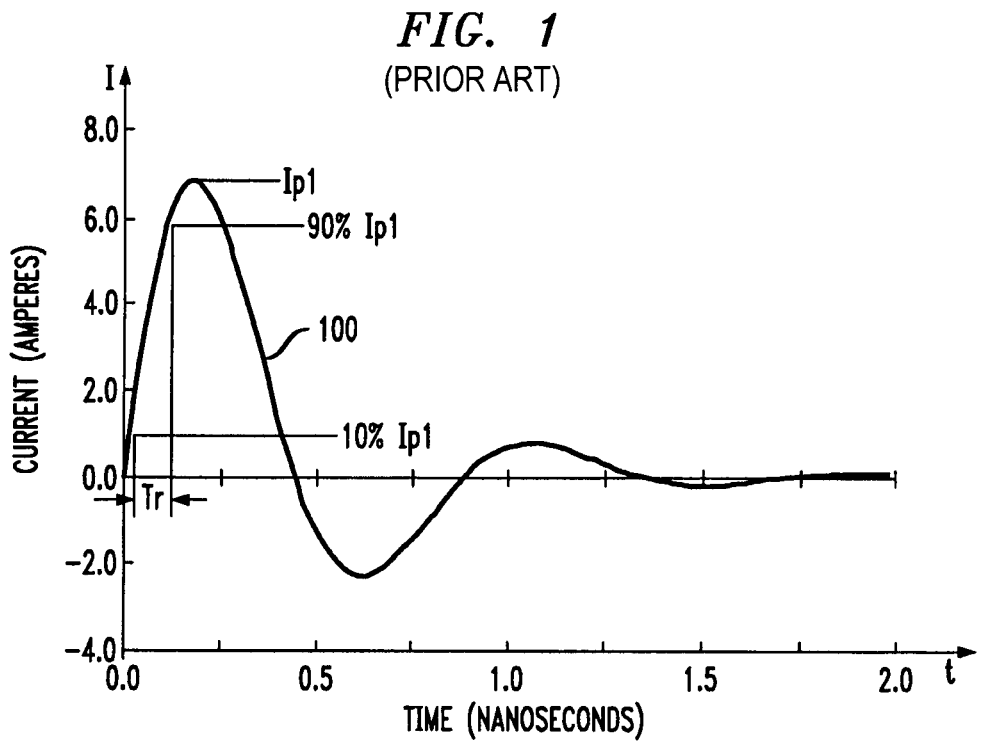
FIG. 1 is a graphical depiction of an exemplary charged device model (CDM) ESD pulse which may be applied, as an input stimulus, to a circuit to be simulated in accordance with techniques of the invention.

FIG. 1 is a graphical depiction of an exemplary CDM ESD pulse 100 which may be applied, as an input stimulus, to a circuit to be simulated in accordance with techniques of the invention. CDM ESD pulse 100 may be generated, for example, by a measurement system having a 3.5 gigahertz bandwidth, although an ESD pulse is not limited to this waveform, nor is the type of ESD stimulus limited to CDM. As apparent from the figure, illustrative ESD pulse 100 has a relatively large peak magnitude, Ipl, of about 7 amperes and a fast rise time, Tr, typically defined as the amount time required for a signal to change from a specified low value (e.g., 10 percent of Ipl) to a specified high value (e.g., 90 percent of Ipl), of about 100 ps. ESD pulse 100 is shown for a charge voltage of about 500 volts. It is to be understood that the invention is not limited an ESD pulse having the specific characteristics shown.

Figure 2A:
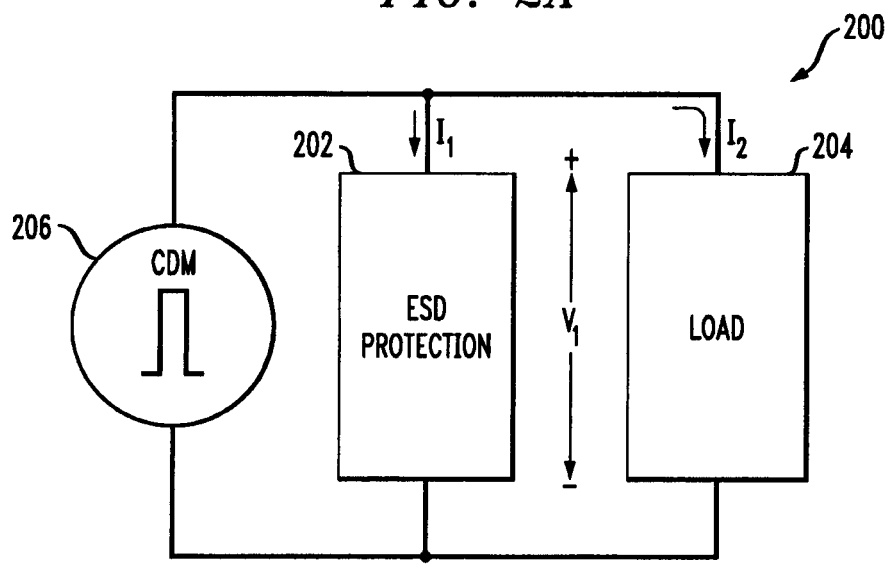
FIG. 2 is a block diagram depicting an exemplary circuit for performing ESD simulation according to techniques of the present invention.

FIG. 2A is a block diagram depicting an exemplary circuit 200 for performing ESD simulation according to techniques of the present invention. Circuit 200 comprises an ESD protection circuit 202 and a load 204 coupled in parallel with the protection circuit. ESD protection circuit 202 may represent any type of circuit or circuit element (e.g., transistor, diode, etc.) operative to protect load 204 from an ESD stimulus 206 applied to the load. ESD stimulus 206 may represent one or more types of ESD stimuli, such as, for example, a CDM or a human body model (HBM) ESD standard. Circuit 200 may be simulated in a circuit simulation program and the ESD stimulus 206 applied to ESD protection circuit 202 and load 204 to measure simulated voltage (e.g., $V_1$) and current (e.g., $I_1$, $I_2$) levels at one or more nodes within circuit 200. Circuit 200 includes at least one mutual inductance element. The mutual inductance element is included to model inductive coupling which may be present in the circuit, as shown in the exemplary circuit 250 of FIG. 2B.

Figure 2B:
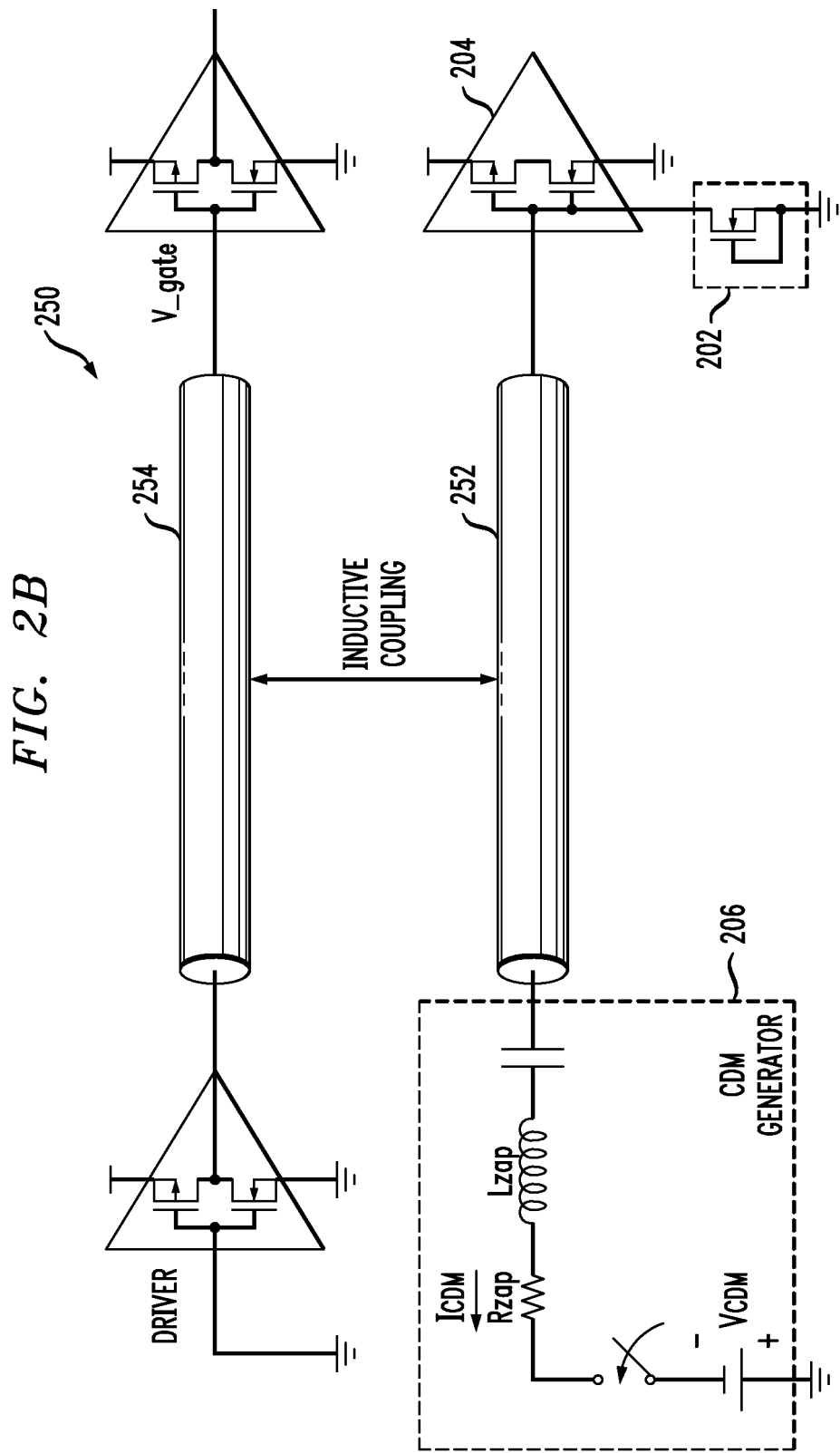

With reference to FIG. 2B, mutual inductance is represented by inductive coupling between a first conductor, 252, and a second conductor, 254, in the circuit 250. As a result of this mutual inductance, there will be an unexpected current path through conductor 254 that affects transistors in the core circuitry during the ESD event. This unexpected current path is slightly different from the current paths (e.g., $I_1$, $I_2$) described above in conjunction with FIG. 2A. Although the mutual inductance element preferably represents coupling between two or more wires as shown, such mutual inductance may be similarly attributable to magnetic coupling between two or more components, and/or between at least one component and at least one conductor (e.g., wire) in the circuit.

As previously stated, simulation of a circuit in response to an input stimulus (e.g., ESD pulse) having a fast rise or fall time, such as, for example, on the order of about a few tens of picoseconds or less, and a large magnitude voltage and/or current, such as, for example, on the order of hundreds of volts and/or several amperes, is particularly challenging. Two dominant origins of nonconvergence or slow convergence problems associated with transient analysis are rapid voltage transitions and device model discontinuities, both of which are characteristic of an ESD simulation. Embodiments of the present invention advantageously reduce the likelihood of nonconvergence or slow convergence problems by performing an alternating current (AC) analysis of the circuit rather than performing a transient analysis, as is conventionally done.

Figure 3:
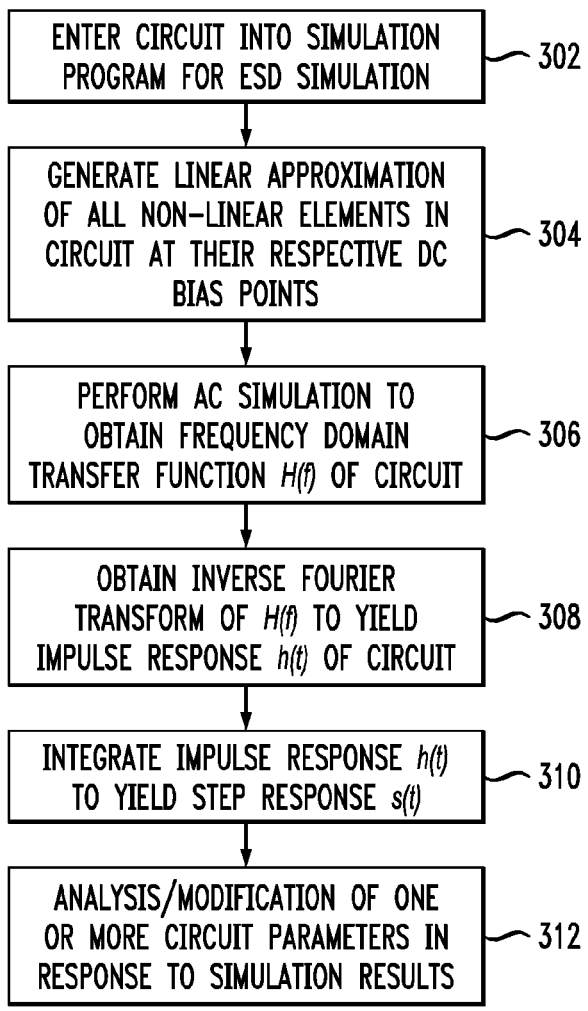
FIG. 3 is a flow diagram depicting steps in an exemplary ESD simulation method according to an embodiment of the invention.

With reference now to FIG. 3, a flow diagram depicting steps in an exemplary ESD simulation method 300 is shown, according to an embodiment of the invention. Method 300 may be used, for example, to simulate the response of a circuit to an ESD stimulus, or an alternative input stimulus having a fast rise or fall time, such as, for example, on the order of about a few tens of picoseconds or less, and a large magnitude voltage and/or current, such as, for example, on the order of hundreds of volts and/or several amperes.

In step 302, the circuit to be simulated is first entered into a circuit simulation program, such as, for example, SPICE (Simulation Program with Integrated Circuit Emphasis). While SPICE, or the numerous variants thereof, including but not limited to, HSPICE® (a registered trademark of Synopsys, Inc.), PSpice® (a registered trademark of Cadence Design Systems, Inc.), IS_Spice, and Micro-Cap IV, are perhaps among the most popular commercially available circuit simulation programs, the invention is not limited to use with any particular simulation program and/or hardware platform. The circuit may be entered into the simulation program in the form of an input data file. The data file preferably includes a description of the circuit, often referred to as a "netlist," listing all elements in the circuit and corresponding nodes to which the elements are connected. Information other than the circuit description may be included in the input data file, such as, for example, the type of analysis to be performed.

By way of example only, SPICE reads in a sequential text file (input file) including a description of the circuit to be simulated, and a set of commands specifying the required simulation and output data file. The SPICE input file may comprise "cards" which are either: a Title card, the first line of the input file, used to identify the output; a ".END" card which specifies the end of the input file; a Comment card designating text to be treated as commentary and thus ignored by SPICE; an Element card used to define elements and corresponding nodes to which the elements are connected in defining the circuit to be analyzed; and a Control card, used to specify options to the program and the analyses to be performed.

As part of the circuit entry, step 302 may include generating a set of nodal equations which describe all elements in the circuit. The nodal equation for a given node in the circuit may be generated, for example, by summing currents leaving the given circuit node. Each node in the circuit will have a corresponding node equation associated therewith. In the nodal analysis, the variables (i.e., unknowns) are the node voltages in the circuit. Thus, for N circuit nodes there will be N nodal equations and N unknown voltages for which to solve, where N is an integer greater than one. These nodal equations may be represented as a set of matrices characterizing the linear relationship between voltage and current for every element in the circuit. One known method which can be used for solving simultaneous equations is Gaussian elimination, although alternative approaches are similarly contemplated.

For many circuits, SPICE uses simple nodal analysis techniques to determine the circuit voltages. However, the solution methodology becomes significantly more complex when nonlinear and charge-storage elements are included in the circuit. Accordingly, in step 304 nonlinear elements (e.g., transistors and diodes) in the circuit are reduced to simplified equivalent circuits. This may be accomplished, for example, by generating linear (e.g., piecewise linear) approximations of all nonlinear elements in the circuit at their respective DC bias points.

In step 306, AC simulation is performed to obtain a transfer function, H(f), of the circuit in a frequency domain. In SPICE, for example, an AC frequency sweep analysis is less prone to nonconvergence problems compared to other analysis techniques (e.g., transient analysis). One reason for this is that the AC frequency sweep is a linear small-signal analysis which does not include any nonlinear behavior once the DC bias point of the circuit has been determined. Once the bias point has been found, all nonlinear device models are replaced with corresponding linear small-signal equivalents thereof. Without nonlinear devices in the circuit, the simulation program is able to employ a simpler matrix decomposition (e.g., LU decomposition or Gaussian-elimination) solution methodology which, unlike a transient analysis approach, does not require Newton iterations to solve the circuit nodal equations. Consequently, the AC sweep analysis, once the bias point has been determined, will essentially always converge.

Once the frequency domain transfer function H(f) has been obtained, in step 308 an impulse response, h(t), of the circuit is preferably determined in a time domain as a function of the frequency domain transfer function. The impulse response h(t) of the circuit may be determined, for example, by obtaining an inverse Fourier transform of the frequency domain transfer function H(f), although the invention is not limited to determining the impulse response in this manner.

In step 310, the time domain impulse response h(t) is preferably integrated to yield a step response, s(t), of the circuit. The step response s(t), which is assumed to be ideal (e.g., zero rise time and unit magnitude), is indicative of the ESD input stimulus to the circuit. The output step response generated by the simulation methodology 300 is preferably a voltage waveform experienced by at least one transistor, or other nonlinear circuit element, in the circuit. This waveform (magnitude and duration) can be used to determine whether the transistor will survive an ESD event. In an illustrative case, this methodology is used to assess possible ESD failure among a plurality of transistors (e.g., millions) on a given chip.

As a function of the ESD simulation methodology 300, one or more parameters of the circuit are preferably analyzed and/or modified in step 312 so as to optimize a performance and/or reliability of the circuit in the presence of an ESD event. More particularly, results of the ESD simulation methodology 300 may be analyzed to determine whether or not the circuit will operate within prescribed parameters corresponding to the circuit. The benefits of ESD simulation include the ability to predict circuit performance in response to the ESD stimulus, thereby saving time and cost in a design process of the circuit.

Figure 4:
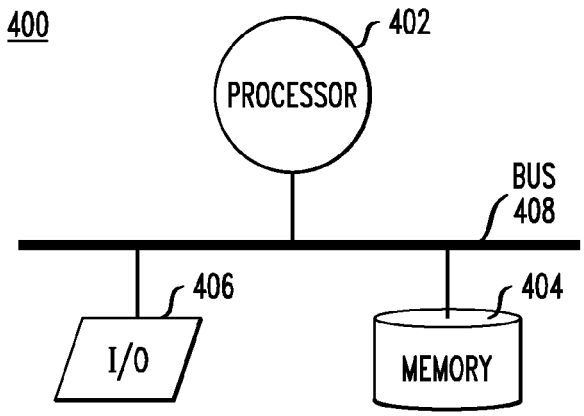
FIG. 4 is block diagram depicting an exemplary electronic system in which techniques of the present invention may be implemented.

One or more embodiments can make use of software running on a general purpose computer or workstation. With reference to FIG. 4, such an implementation might employ, for example, a processor 402, a memory 404, and an input/output (I/O) interface 406 formed, for example, by a display and a keyboard (not explicitly shown). The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 402, memory 404, and I/O interface 406 can be interconnected, for example, via bus 408 as part of a data processing unit 400. Suitable interconnections, for example via bus 408, can also be provided to a network interface (not explicitly shown), such as a network card, which can be provided to interface with a computer network, and to a media interface, such as a diskette or CD-ROM drive, which can be provided to interface with media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and executed by a CPU. Such software could include, but is not limited to, firmware, resident software, microcode, and the like.

Furthermore, the invention can take the form of a computer program product accessible from a computer-usable or computer-readable medium providing program code for use by or in connection with a computer or any instruction execution system. For the purposes of this description, a computer usable or computer readable medium can be any apparatus for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid-state memory (for example memory 404), magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

An electronic system, preferably a data processing system, suitable for storing and/or executing program code will include at least one processor 402 coupled directly or indirectly to memory elements 404 through a system bus 408. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, and the like) can be coupled to the system either directly (such as via bus 408) or through intervening I/O controllers (omitted for clarity).

Network adapters such as network interface (not explicitly shown) may also be coupled to the system to enable the data processing system to become coupled to other data processing systems or remote printers or storage devices through intervening private or public networks. Modems, cable modem and Ethernet cards are just a few of the currently available types of network adapters.

In any case, it should be understood that the methodology illustrated herein may be implemented in various forms of hardware, software, or combinations thereof, for example, application specific integrated circuit(s) (ASICS), functional circuitry, one or more appropriately programmed general purpose digital computers with associated memory, and the like.

Given the teachings of the invention provided herein, one of ordinary skill in the related art will be able to contemplate other implementations of the components of the invention.

As previously stated, at least a portion of the circuits and methodologies of the present invention may be implemented in one or more integrated circuits. In forming integrated circuits, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

Simulation techniques of the present invention can be employed in any application and/or electronic system in which it is desirable to predict circuit performance in response to an ESD stimulus, or alternative input stimulus having a substantially fast rise or fall time and substantially large voltage and/or current magnitude. Suitable systems for implementing techniques of the invention may include, but are not limited to, personal computers, electronic instruments (e.g., automated test equipment (ATE)), etc. Systems incorporating such techniques are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A computer-implemented method for simulating a response of a circuit to an electrostatic discharge (ESD) input stimulus applied to the circuit, the circuit including at least one mutual inductance element indicative of magnetic coupling in the circuit, the method comprising the steps of:
   generating a linear approximation of nonlinear elements in the circuit at respective direct current (DC) bias points of the nonlinear elements based on a description of the circuit;
   obtaining a frequency domain transfer function of the circuit;
   obtaining a time domain impulse response of the circuit as a function of the frequency domain transfer function;
   integrating the impulse response to yield a step response of the circuit, the step response being indicative of a response of the circuit to the ESD input stimulus; and
   analyzing the step response of the circuit to determine whether the circuit will operate within prescribed parameters corresponding to the circuit.

2. The method of claim 1, further comprising receiving a description of the circuit into a circuit simulation program by generating a list of all elements in the circuit and corresponding nodes to which the elements are connected.

3. The method of claim 1, further comprising receiving a description of the circuit into the circuit simulation program by generating a set of nodal equations which describe all elements in the circuit.

4. The method of claim 3, wherein each node in the circuit has a different one of the nodal equations corresponding thereto, and each nodal equation is generated by summing all currents leaving a corresponding node.

5. The method of claim 1, further comprising receiving a description of the circuit into the circuit simulation program by generating a list of all elements in the circuit and corresponding nodes that connect the elements together.

6. The method of claim 1, wherein the step of generating a linear approximation of nonlinear elements in the circuit comprises determining an equivalent linear model for each corresponding nonlinear element in the circuit, the linear model including a series of piecewise linear approximations representing an operation of the corresponding nonlinear element at a plurality of voltage bias points.

7. The method of claim 1, wherein the step of obtaining the frequency domain transfer function of the circuit comprises determining a signal at each output node of the circuit in response to a stimulus applied to each input node in the circuit as a frequency of the stimulus is varied over a prescribed frequency range.

8. The method of claim 1, wherein the step of obtaining the impulse response of the circuit comprises determining an inverse Fourier transform of the transfer function of the circuit.

9. The method of claim 1, further comprising a step of modifying at least one parameter of the circuit as a function of the step response of the circuit.

10. The method of claim 1, wherein the at least one mutual inductance element is adapted for modeling inductive coupling between two or more conductors in the circuit.

11. Apparatus for simulating a response of a circuit to an electrostatic discharge (ESD) input stimulus applied to the circuit, the circuit including at least one mutual inductance element indicative of magnetic coupling in the circuit, the apparatus comprising:
   memory; and
   at least one processor coupled to the memory and operative: to generate a linear approximation of nonlinear elements in the circuit at respective direct current (DC) bias points of the nonlinear elements based on a description of the circuit; to obtain a frequency domain transfer function of the circuit; to obtain a time domain impulse response of the circuit as a function of the frequency domain transfer function; to integrate the time domain impulse response to yield a step response of the circuit, the step response being indicative of a response of the circuit to the ESD input stimulus; and to analyze the step response of the circuit to determine whether the circuit will operate within prescribed parameters corresponding to the circuit.

12. The apparatus of claim 11, wherein the at least one processor is further operative to generate a list of all elements in the circuit and corresponding nodes to which the elements are connected.

13. The apparatus of claim 11, wherein the at least one processor is further operative to generate a set of nodal equations which describe all elements in the circuit.

14. The apparatus of claim 13, wherein each node in the circuit has a different one of the nodal equations corresponding thereto, and each nodal equation is generated by summing all currents leaving a corresponding node.

15. The apparatus of claim 11, wherein the at least one processor is further operative to determine an equivalent linear model for each corresponding nonlinear element in the circuit, the linear model including a series of piecewise linear approximations representing an operation of the corresponding nonlinear element at a plurality of voltage bias points.

16. The apparatus of claim 11, wherein the at least one processor is operative to obtain the frequency domain transfer function of the circuit by determining a signal at each output node of the circuit in response to a stimulus applied to each input node in the circuit as a frequency of the stimulus is varied over a prescribed frequency range.

17. The apparatus of claim 11, wherein the at least one processor is operative to obtain the impulse response of the circuit by determining an inverse Fourier transform of the transfer function of the circuit.

18. The apparatus of claim 11, wherein the at least one processor is further operative to modify at least one parameter of the circuit as a function of the step response of the circuit.

19. The apparatus of claim 11, wherein the memory comprises embedded memory.

20. A computer program product comprising a tangible computer readable recordable storage medium including non-transitory computer usable program code for simulating a response of a circuit to an electrostatic discharge (ESD) input stimulus applied to the circuit, the circuit including at least one mutual inductance element indicative of magnetic coupling in the circuit, the computer program product comprising computer usable program code for performing steps of:
  generating a linear approximation of nonlinear elements in the circuit at respective direct current (DC) bias points of the nonlinear elements based on a description of the circuit;
  obtaining a frequency domain transfer function of the circuit;
  obtaining a time domain impulse response of the circuit as a function of the frequency domain transfer function;
  integrating the impulse response to yield a step response of the circuit, the step response being indicative of a response of the circuit to the ESD input stimulus; and
  analyzing the step response of the circuit to determine whether the circuit will operate within prescribed parameters corresponding to the circuit.

* * * * *